(12) United States Patent
Noel et al.

(10) Patent No.: US 12,646,561 B2
(45) Date of Patent: Jun. 2, 2026

(54) SRAM MEMORY WITH RANDOM DETERMINISTIC INITIALIZATION

(71) Applicant: COMMISSARIAT À L'ENERGIE ATOMIQUE ET AUX ÉNERGIES ALTERNATIVES, Paris (FR)

(72) Inventors: Jean-Philippe Noel, Grenoble (FR); Bastien Giraud, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 121 days.

(21) Appl. No.: 18/544,705

(22) Filed: Dec. 19, 2023

(65) Prior Publication Data

US 2024/0203487 A1 Jun. 20, 2024

(30) Foreign Application Priority Data

Dec. 20, 2022 (FR) ........................................ 2213917

(51) Int. Cl.
*G11C 11/418* (2006.01)

(52) U.S. Cl.
CPC .................................. *G11C 11/418* (2013.01)

(58) Field of Classification Search
CPC ............................. G11C 11/418; G11C 11/419
USPC .................................................... 365/230.01
See application file for complete search history.

(56) References Cited

U.S. PATENT DOCUMENTS

| | | | | |
|---|---|---|---|---|
| 9,608,827 B1 | 3/2017 | Trimberger | | |
| 10,432,198 B1 * | 10/2019 | Wang | .............. | H03K 19/00315 |

| | | | | |
|---|---|---|---|---|
| 2009/0083495 A1 * | 3/2009 | Khellah | .............. | G06F 11/1048 |
| | | | | 711/143 |
| 2013/0129083 A1 | 5/2013 | Fujino | | |
| 2014/0369139 A1 | 12/2014 | Van Winkelhoff et al. | | |
| 2021/0142839 A1 * | 5/2021 | Prabhat | .............. | G11C 11/4094 |
| 2021/0247964 A1 * | 8/2021 | Khwa | .................... | G06F 7/582 |
| 2022/0199153 A1 | 6/2022 | Nagata | | |
| 2022/0300255 A1 * | 9/2022 | Shu | .................... | G11C 11/4078 |
| 2022/0385486 A1 | 12/2022 | Chung | | |

FOREIGN PATENT DOCUMENTS

| | | |
|---|---|---|
| FR | 3074604 A1 | 6/2019 |
| FR | 3128570 A1 | 4/2023 |

OTHER PUBLICATIONS

French Preliminary Search Report for French Patent Application No. dated Jul. 7, 2023.

(Continued)

*Primary Examiner* — Sung Il Cho
(74) *Attorney, Agent, or Firm* — McDonald Hopkins LLC

(57) ABSTRACT

Static random access memory device comprising a matrix in which each column is associated with an initialization circuit (100*i*, 100*j*), provided with a stage (110) for drawing a random value (110), configured to, following the reception of the initialization activation signal (RAND_ENABLE), produce, in a random manner, respectively a first potential at a first node (NA) corresponding to a given logic state and a second potential at a second output node (NB) different from the first potential and corresponding to a given logic state complementary to said given logic state, in order to initialize cells of a same column to a given state selected randomly between two states.

9 Claims, 3 Drawing Sheets

(56) References Cited

OTHER PUBLICATIONS

S. Kumar et al., "Impact of NBTI on SRAM Read Stability and Design for Reliability", ISQED 2006.
W.-G. Ho et al., "A Secure Data-Toggling SRAM for Confidential Data Protection", IEEE TCAS-I 2019.
J. McMahan et al., "Challenging On-Chip SRAM Security with Boot-State Statistics", HOST 2017.
R. Giterman et al., "Power Analysis Resilient SRAM Design Implemented with a 1% Area Overhead Impedance Randomization Unit for Security Applications", ESSCIRC 2019.

* cited by examiner

SRAM MEMORY WITH RANDOM DETERMINISTIC INITIALIZATION

CROSS-REFERENCE TO RELATED APPLICATIONS

This application claims priority from French Patent Application No. 2213917 filed on Dec. 20, 2022. The content of this application is incorporated herein by reference in its entirety.

TECHNICAL FIELD

The present invention relates to the field of memories, and in particular SRAM (Static Random Access Memory), and more specifically the initialization of SRAM memories.

The present invention implements an improved initialization circuit.

PRIOR ART

Transistors using PMOS technology are subject to a physical phenomenon known as NBTI (Negative-Bias Temperature Instability), which has the effect of increasing their threshold voltage, all the more so when their dimensions are reduced. This phenomenon is exacerbated when the temperature and/or the negative voltage VGS applied between the gate and the source of the transistor increase.

An SRAM memory cell is commonly provided with two inverters cross-coupled head-to-tail, each consisting in particular of a first P-type transistor and a second N-type transistor, with a VTP1/VTP2 ratio of their respective threshold voltages of the two PMOS transistors.

The value stored in an SRAM memory cell will influence the PMOS transistors of a memory cell in different ways and the VTP1/VTP2 ratio will change over time in one direction or the other depending on the stored value.

The NBTI phenomenon therefore influences the probability of an SRAM cell initializing spontaneously (when powered up) at logic level '1' or at its opposite level '0', given that the logic level of initialization is linked to the VTP1/VTP2 ratio.

Memory data from the initialization of SRAM cells can be used to generate encryption keys or a unique hardware identifier or digital fingerprint. They can be used to form a physical unclonable function (PUF).

Certain cells with a high VTP1/VTP2 ratio can in particular be identified as cells that are sufficiently stable to be used to form a PUF during a so-called enrolment phase.

However, due to the effects of the aforementioned NBTI phenomenon, the VTP1/VTP2 ratio can change over time, making the cells less suitable for being used to form a PUF.

In order to limit such degradation of SRAM cells over time, one technique involves inverting the contents of horizontal rows of memory cells on a regular basis. Such a technique leads to an increase in power consumption and is detrimental in terms of the time during which the system can access the memory cells.

Bit inversion techniques are described in the document "*Impact of NBTI on SRAM Read Stability and Design for Reliability*", by S. Kumar et al., ISQED 2006 or in the document "*A Secure Data-Toggling SRAM for Confidential Data Protection*", by W.-G. Ho et al., IEEE TCAS-I 2019. In the last document, the proposed solution has the disadvantage of modifying the cell structure by adding additional transistors. In all cases, the periodic inversion of bits wastes time and energy in the memory user circuit.

One issue associated with the effects of NBTI and which has an influence on data security is the so-called data imprint effect. Such an effect is described in the document: "*Challenging On-Chip SRAM Security with Boot-State Statistics*", by J. McMahan et al., HOST 2017. When data stored in memory remains there for a long time (with a memory in operation, powered up), the threshold voltage VTP of the conducting PMOS transistor changes, due to the same physical effect that causes NBTI. A harmful remanence or "data imprint" effect means that it may be possible to retrieve previously stored data even when the memory is reset.

Techniques such as correlated power analysis (CPA) or differential power analysis (DPA) can be used to reveal data that is intended to remain secret, based inter alia on this phenomenon of drift in the threshold voltage of transistors and using means to accelerate this drift. Such a technique is described, for example, in the document: "*Power Analysis Resilient SRAM Design Implemented with a 1% Area Overhead Impedance Randomization Unit for Security Applications*", by R. Giterman et al., ESSCIRC 2019.

The aim is to produce a memory device that improves on at least one of the aforementioned issues.

DESCRIPTION OF THE INVENTION

According to one aspect, the present invention relates to a memory device comprising a memory matrix arranged in rows and columns of SRAM memory cells, each column comprising a first bit line and a second complementary bit line respectively connected to access transistors of the memory cells of the column, each column being associated with an initialization circuit comprising a first coupling element and a second coupling element positioned respectively between, on the one hand, the first and second bit lines of the associated column and, on the other hand, a control block, the control unit being able to impose a voltage on the bit lines when at least one of said coupling elements is rendered conductive in a deterministic initialization mode of all or some of the cells of the column, and wherein said control unit comprises at least one stage for drawing a random value, in order to generate a value from two possible values "0" or "1" associated with a column, and wherein, in a so-called random deterministic initialization phase, the control unit successively controls for at least one selected column:

the generation of a random value by said stage for drawing a random value associated with each selected column; then the activation of at least one coupling element from said first and second coupling elements of an initialization circuit associated with each selected column in order to connect at least one of the bit lines to the control unit which imposes a voltage value, the choice of said activated coupling element or the choice of the voltage value imposed being a function of the previously generated random value for the selected column, and the simultaneous activation of at least one access transistor of at least one cell of the selected column.

The stage for drawing a random value is able to be coupled to a column of cells from said columns and provided with a first output node and a second output node, said stage for drawing a random value being configured to, following the reception of an initialization activation signal, produce, in a random manner, respectively a first potential at the first node corresponding to a given logic state and a second potential at the second output node different from the first potential and corresponding to a given logic state comple-
mentary to said given logic state, at least one first initialization circuit associated with a first
column being configured to, prior to a so-called random
deterministic initialization phase:

isolate the first output node and the second output node
respectively from a first bit line and a second bit line of
said first column while setting the first output node and
the second node to a same potential, then, during the random deterministic initialization phase
triggered by the reception of said initialization activa-
tion signal, allow the first output node and the second node to be set
respectively at different potentials, while coupling the
first output node to said first bit line and the second
output node to said second bit line of the first column.

Advantageously, the stage for drawing a random value is
provided with a first inverter and a second inverter that are
cross-coupled.

According to a possible embodiment, the initialization
circuit comprises:

a transistor switching stage, arranged between a first
biasing element and the output nodes of said stage for
drawing a random value, configured to, outside random
deterministic initialization phases, connect the output
nodes of said stage for drawing a random value to the
first biasing element and to isolate the output nodes of
the stage for drawing a random value from said first
biasing element during said random deterministic ini-
tialization phases, a switch element, in particular a transistor, configured to,
outside said random deterministic initialization phases,
isolate said stage for drawing a random value from a
second biasing element and during said random deter-
ministic initialization phases, connect said stage for
drawing a random value to said second biasing ele-
ment.

According to a possible embodiment, the transistor
switching stage can be configured, outside of said random
deterministic initialization phases, to isolate the output
nodes of said stage for drawing a random value from one
another and, during said random deterministic initialization
phases, to connect the output nodes of said stage for drawing
a random value to one another.

According to a possible embodiment, the first coupling
element is a first coupling transistor between the first bit line
and a first output node of the stage for drawing a random
value, wherein the second coupling element is a second
coupling transistor arranged between the second bit line and
a second output node of the stage for drawing a random
value, the first coupling transistor and the second coupling
transistor being controlled by said random deterministic
initialization activation signal.

Advantageously, the stage for drawing a random value
can comprise a shared circuit for drawing a random number
over several bits, each bit being associated with a column.

According to a possible embodiment of the device, at least
part of the memory cell matrix includes so-called sensitive
cells and the device comprises a memory controller able to
impose a random deterministic initialization of these sensi-
tive cells when the memory device is powered up or fol-
lowing an operation to delete the memory matrix.

According to another aspect, the present application
relates to a static random access memory device comprising
a memory matrix arranged in rows and columns of SRAM
memory cells, each column being associated with an initial-
ization circuit, a first initialization circuit from said initialization circuits associated with a first column from said
columns being provided with a stage able to be coupled to
a column of cells from said columns and provided with a
first output node and a second output node, said random
drawing stage being configured to, following the reception
of the initialization activation signal, produce, in a random
manner, respectively a first potential at the first node corre-
sponding to a given logic state and a second potential at the
second output node different from the first potential and
corresponding to a logic state complementary to said given
logic state, the first initialization circuit being configured to,
prior to a so-called random deterministic initialization
phase:

isolate the first output node and the second output node
respectively from a first bit line and a second bit line of
said column while setting the first output node and the
second node to a same potential, then, during the
random deterministic initialization phase triggered by
the reception of said initialization activation signal:

allow the first output node and the second node to be set
respectively at different potentials, while coupling the
first output node to said first bit line and the second
output node to said second bit line.

With such an initialization circuit, a new way of initial-
izing the cells of a same column to a same defined state is
provided, and in particular makes it possible to overcome the
phenomenon of data imprint. Such a circuit helps improve
data security and makes the use of certain memory cells
more reliable, in particular those for forming a PUF.

According to a possible embodiment, the initialization
circuit comprises:

a transistor switching stage, arranged between a biasing
means and the output nodes of said stage, configured to,
outside random deterministic initialization phases, con-
nect the output nodes of said random drawing stage to
the first biasing element and to isolate the output nodes
of said random drawing stage from said first biasing
element during said random deterministic phases, a switch element, in particular a transistor, configured to,
outside said random deterministic phases, isolate said
drawing stage from a biasing element and during said
random deterministic phases, connect said random
drawing stage to said biasing element.

Advantageously, the transistor switching stage can also be
configured, outside of said random deterministic phases, to
isolate the output nodes of said drawing stage from one
another and, during said random deterministic phases, to
connect the output nodes of said drawing stage to one
another.

According to a possible embodiment, the initialization
circuit comprises:

a first coupling transistor between the first bit line and the
first output node, a second coupling transistor arranged between the second
bit line and the second output node, the first coupling
transistor and the second coupling transistor being
controlled by said random deterministic initialization
activation signal.

Advantageously, during the so-called random determin-
istic phase:

said drawing stage of said first initialization circuit
respectively produces a first potential at its first node
and a second potential at its second node, different from
the first potential and corresponding to a logic state
complementary to said first logic state, a second initialization circuit associated with a second
column from said columns being provided with a second drawing stage identical to said drawing stage and respectively producing said second potential and said first potential respectively at its first output node and at its second output node.

Advantageously, during a subsequent random deterministic phase, said drawing stage of said first initialization circuit produces, following the reception of said same initialization activation signal, respectively a first potential at its first output node and a second potential at its second output node.

BRIEF DESCRIPTION OF THE DRAWINGS

The present invention will be better understood upon reading the description of exemplary embodiments provided purely by way of example and in a non-limiting manner, with reference to the appended drawings in which.

Identical, similar or equivalent parts of the various figures bear the same numerical references so as to facilitate the transition from one figure to the other.

The various parts shown in the figures are not necessarily according to a uniform scale, in order to make the figures more readable.

DETAILED DISCLOSURE OF PARTICULAR EMBODIMENTS

Figure 1:
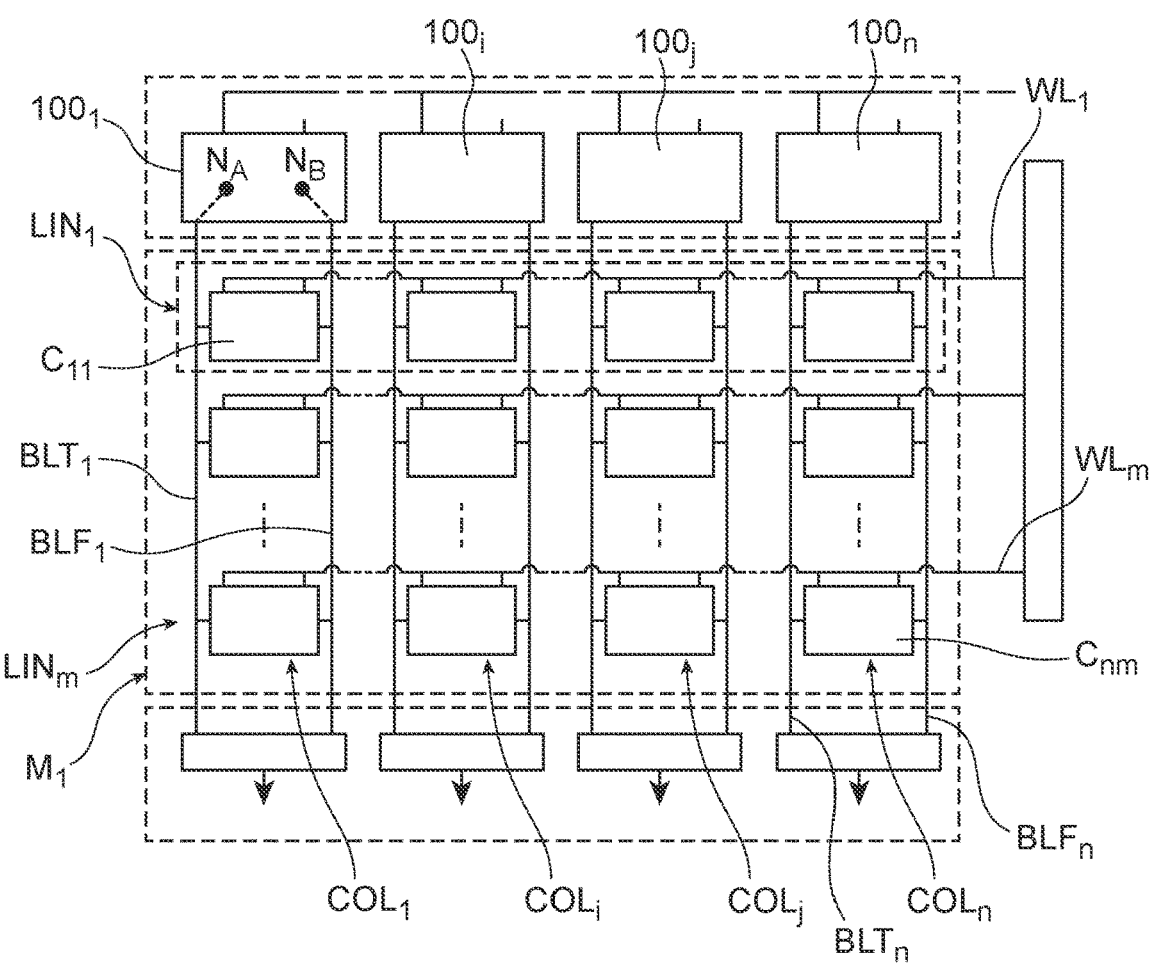
FIG. 1 shows a matrix of SRAM memory cells, the columns of which are each provided with a column random deterministic initialization circuit as implemented according to the invention.

An example of an SRAM memory device is given in FIG. 1 and has a memory plane $M_1$ consisting of a plurality of columns $COL_1, \ldots, COL_n$ (where n is an integer strictly greater than 1, the columns corresponding to vertical rows in this example) and of rows $LIN_1, \ldots, LIN_m$ (where m is an integer strictly greater than 1, the rows corresponding to horizontal rows in FIG. 1) comprising n*m distinct SRMA memory cells $C_{11}, \ldots, C_{nm}$.

Conventionally, each column of cells is associated with a pair of bit lines from a set of pairs of bit lines $BLT_1$, $BLF_1, \ldots, BLT_n, BLF_n$. Similarly, each row of cells is typically associated with a word line from a set of word lines $WL_1, \ldots, WL_m$. When activated, each word line enables the memory cells of a given row of SRAM cells to be selected from said SRAM cell rows.

An initialization phase of the SRAM memory cells is provided when the memory device is powered up, but also following an operation to delete the memory, for example following the detection of a fraudulent attempt to access the memory without having to turn off the entire memory device to reinitialize the contents of the memory. During an operation to delete the memory, the internal nodes of the memory cells can be set to identical or substantially identical values (i.e. that differ by less than 10 mV), either by short-circuit, or by discharge of the nodes following a power cut. One possible initialization phase therefore involves switching a memory cell from an "undetermined" state (which cannot be determined by reading) to a state with a "determine" stored value (which can therefore be determined by reading).

Figure 2:
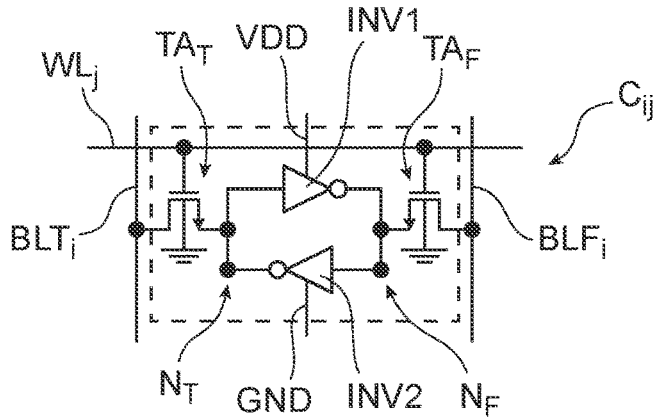
FIG. 2 shows an SRAM memory cell with a conventional arrangement that can be integrated into a memory device according to the invention.

The present application follows on from other patent applications submitted by the applicant related to the subject of SRAM memory devices. Reference can therefore be made to patent application FR, no. 1761692, filed on 6 Dec. 2017 which describes a rapid deletion mechanism. Reference can also be made to a second French patent application no. 2111286 filed by the applicant on 25 Oct. 2021 with the French National Institute of Industrial Property which describes an SRAM memory initialization device, according to several possible modes, a free mode and a deterministic mode. We will now adopt the same vocabulary as this second patent application. A so-called "free" initialization mode involves letting each memory cell initialize to its own value when the elements that make up the memory cell are gradually powered up, in particular two looped-backed inverters as shown in FIG. 2, without attempting to impose a "0" or "1" value on the internal nodes $N_T$ and $N_F$ of the cell. In the free initialization mode, the access transistors $TA_T$ and $TA_F$ are non-conducting, the cell being "isolated" from the other cells and bit lines BLT and BLF. In contrast, a so-called "deterministic" initialization mode involves imposing or forcing a value to be stored by the cell when it switches from an indeterminate state to a determined state. In order to impose a value during initialization, the memory device comprises means at the foot of the column for imposing a value on the internal nodes of the cells being initialized, via the bit lines and by making the access transistors of the cells in question conductive. In this second patent application, the initialization value to be imposed can be "0" or "1". The deterministic initialization means described in this second application, in particular with reference to its FIG. 4, enable all the memory cells to be written either to "0" or "1". To do this, the device is configured to control, for each column, one of the bit lines BLT or BLF by connecting it to a supply voltage by switching on a bit line selection transistor. The bit line selected and powered thus tends to impose a value "1" on one of the nodes of each memory cell connected to this bit line.

In the present patent application, an initialization circuit, in particular a deterministic one, within the meaning given above, and which enables a value to be imposed on all or some of the cells of a same column; this same value having been previously defined by a random drawing method.

The expression "random deterministic initialization" will be used hereinafter for this type of initialization, which takes place in two stages, random drawing followed by "forced" initialization as will be better understood by reading the detailed examples provided below.

One special feature of the device here is associating a column initialization circuit $100_1, \ldots, 100_n$ with each column $COL_1, \ldots, COL_n$ of cells, configured to implement an initialization phase of the cells of a column of the so-called random deterministic initialization matrix. The initialization circuits $100_1, \ldots, 100_n$ are typically also each provided with a portion at the end of a column and coupled to a pair of bit lines from the set of pairs of bit lines $BLT_1$, $BLF_1, \ldots, BLT_n, BLF_n$. Each column initialization circuit $100_1, \ldots, 100_n$ is configured to, during a random deterministic initialization per column, initialize the column of cells with which this circuit is associated by placing all the cells making up this column in a same given state. This same initialization state is determined by the equivalent of "random drawing" or pseudo-random drawing carried out outside of the matrix of cells and applied to all or some of the cells of a same column during their initialization. This "random deterministic" initialization state is produced randomly or pseudo-randomly by a "random drawing" stage 110 (not shown in this figure) of the initialization circuit $100_1, \ldots, 100_n$.

The initialization circuit $100_1, \ldots, 100_n$ is preferably provided such that when a "random deterministic initialization" phase is triggered, nodes NA, NB of this circuit are established randomly and according to a probability close to 0.5, respectively at a first potential between a high or low potential corresponding to a given logic state, and at a second potential between a low or high potential, the second potential being different from the first potential and corresponding to a logic state complementary to the given logic state.

In this way, from one "random deterministic" initialization operation to the next, each column $COL_i$ can have, as a function of random drawing, its cells $C_{1i}, \ldots, C_{ni}$ all initialized in a same state, which is the same state as during a previous initialization operation or in an opposite state. The sequence of initialization values of a same column is random.

Following initialization carried out by means of the circuits $100_i, 100_j$, the respective cells $C_{1i}, \ldots, C_{ni}$ and $C_{1j}, \ldots, C_{nj}$ of distinct columns $COL_i, COL_j$ can all be initialized, as a function of random drawing per column carried out by their respective circuits $100_i, 100_j$, in a same state (corresponding to a '1' or a '0' on one of their two nodes) but this case is unlikely statistically speaking or in different states from one column $COL_i$ to the other $COL_j$.

These initialization circuits $100_1, \ldots, 100_n$ integrating random deterministic initialization of the memory cells make it possible to counter CPA and DPA attacks for memory areas where the user does not control the initialization value. Indeed, as explained in the aforementioned document, in order to carry out this type of attack, it is necessary to know the initialization value or at the very least to know that the initialization value is always the same. These methods often use a repetition of an initialization, possibly followed by a stress phase and a post-processing procedure based on the hypothesis that the initialization values of the cells are always the same. Thus, by using an initialization circuit according to the invention that enables memory cells to be initialized to unknown values that vary over time, thanks to random drawing, it is possible to thwart this type of attack.

Moreover, when initializations are repeated and lead to different values in the memory cells, the ageing phenomenon in these cells is reduced. Indeed, from a statistical point of view, if the memory cells are left in their initialization state and this is changed regularly during successive initialization operations, it is not always the same PMOS transistor that ages more quickly, which statistically limits the drift in the ratio of threshold voltages VTP1/VTP2.

These results are achieved while limiting the impact on the matrix itself in terms of the memory device footprint. The random deterministic initialization circuits $100_1, \ldots, 100_n$ thus contribute to the hardware security of the memory data.

It should be noted that the use of random deterministic initializations for a PUF area of the memory also improves the reliability of the PUF area by limiting the ageing of the transistors, or rather by limiting the drift of the ratio VTP2/VTP1 unlike a circuit in which the initialization of the PUF area would always be carried out freely, leading to the same values being stored in the memory cells as long as they have not been overly affected by NBTI.

The internal structure of the cells $C_{11}, \ldots, C_{nm}$ of the memory device can have a conventional arrangement, as in FIG. 2, which shows an exemplary SRAM cell structure $C_{ij}$ of the memory device. The cell $C_{ij}$ is equipped with two storage nodes $N_T$ and $N_F$, provided to retain a first item of logic information, and an item of logic information complementary to the first item of information. Logic information is maintained in the nodes by transistors forming inverters INV1, INV2 connected in a loop. For example, when the SRAM cell is of the type commonly known as "6T" and thus made up of 6 transistors. The two inverters INV1, INV2 are typically formed by two load transistors and two conduction transistors. The inverters INV1, INV2 are connected here to a first supply line, in particular a so-called "high" supply line, and a second supply line, in particular a so-called "low" supply line. The supply line is set to a so-called "high" potential, for example equal to a supply voltage VDD, which is consequently greater than the "low" potential of the low supply line, and typically corresponds to a reference or ground potential GND. The storage nodes $N_T$ and $N_F$ are accessed via two access transistors $TA_T$ and $TA_F$ respectively connected to bit lines $BLT_i$ and $BLF_i$ shared by the SRAM cells of a same column COLi of cells of the matrix plane.

This access to the storage nodes $N_T$ and $N_F$ is controlled by a word line $WL_j$ generally shared by the SRAM cells of a same row LINj of cells of the matrix plane. The access transistors $TA_T$ and $TA_F$ are thus provided, when they are activated, to enable access to the first node $N_T$ and to the second node $N_F$, or when they are deactivated, to block access to the first node $N_T$ and to the second node $N_F$.

In the present case, during a random deterministic initialization phase, the respective access transistors $TA_T$ and $TA_F$ of the cells of the initialized column are activated in order to enable initialization of each cell of the column.

Figure 3:
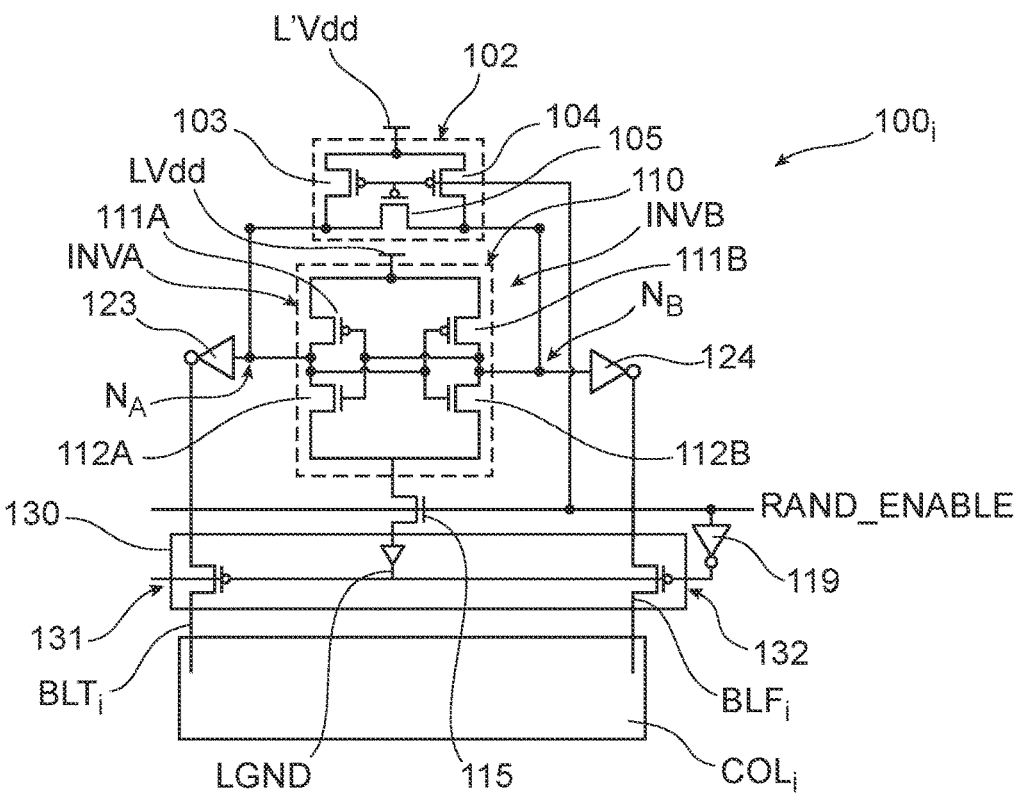
FIG. 3 shows an exemplary embodiment of a column random deterministic initialization circuit for initializing the cells of a same column of cells randomly from one initialization to the next.

FIG. 3 shows a particular exemplary embodiment of an initialization circuit 100i associated with a column COLi of cells. This initialization circuit 100i only requires here the use of a limited number of additional elements peripheral to the memory plane $M_1$. The circuit 100i is provided with a random drawing stage 110, located at the end of a given column COLi. When an initialization activation signal is applied to the circuit 100i, which is expressed here by a rising edge or transition from a '0' state to a '1' state of the signal RAND_ENABLE, the stage 110 produces, as mentioned above, randomly on a first output node $N_A$ and on a second output node $N_B$, respectively, a first high or low potential and a second potential, low or high but different from and logically complementary to the first potential. The activation signal RAND_ENABLE of the "random deterministic initialization" mode can come from a memory controller.

FIG. 3 shows a particular exemplary embodiment of the random drawing stage 110 with a limited number of components and footprint here. This random drawing stage 110 is formed by a first inverter INVA and a second inverter INVB that are cross-coupled and each formed here by a PMOS transistor 111A, 111B and an NMOS transistor 112A, 112B.

Large transistors 111A, 112A, 111B, 112B are preferably chosen, for example equal in size to the transistors forming a sense amplifier with which the column COLi is associated.

The first inverter INVA is preferably configured with transistors 111A, 112A substantially identical to the transistors 111B, 112B of the second first inverter INVB.

"Substantially identical" is understood here to mean that the transistors 111A, 111B, on the one hand, and 112A, 112B, on the other, are provided with similar structures and dimensions and that any differences that do exist are principally a result of local variability in the manufacturing process.

Similarly, each random drawing stage 110 is preferably identical or substantially identical to the other random drawing stages of the other initialization circuits distributed over different columns.

The inverters INVA, INVB of the random drawing stage 110 are coupled, for their high supply, to a first biasing element, for example a supply line LVdd, enabling a high supply potential to be delivered, for example Vdd.

A switch element, in particular a switch transistor 115, of NMOS type here, is arranged between a second biasing element and the stage 110. The gate of the switch transistor 115 is controlled by the activation signal RAND_ENABLE provided to activate a random deterministic initialization phase.

The second biasing element, for example a supply line LGND, is provided to deliver a reference or ground potential GND.

The initialization circuit 100i is also provided here with a switching stage 102, provided with transistors 103, 104, in particular of PMOS type, which enables the two output nodes NA and NB to be connected to a same potential, a high potential Vdd here outside of the random deterministic initialization phases. The gates of the transistors 103, 104 are also controlled by the initialization activation signal RAND_ENABLE. Outside of the "random deterministic initialization" phases, the switch transistor 115 isolates the stage 110 from the second biasing element, which helps to maintain the output nodes NA and NB of the drawing stage 110 at a same potential in association with the action of the aforementioned switching stage.

The switch transistor 115 is provided here, following the reception or change of state of the initialization activation signal RAND_ENABLE, to connect the inverters INVA, INVB to the so-called "low" supply line LVss, which enables the nodes NA and NB to be maintained and discharged respectively.

During random deterministic initialization phases, the switching stage 102 isolates the two output nodes NA and NB from the high supply potential Vdd, to enable the output nodes NA and NB of the stage 110 to be set at different potentials, once the stage 110 is resupplied by the transistor 115 being turned on.

The switching stage 102 is advantageously also provided here with an additional switching transistor 105, for example of PMOS type, between the first node NA and the second node NB in order to ensure good equalization of the "start" potentials of these two nodes prior to powering up the stage 110 when new random drawing is carried out.

The transistor 105, the gate of which is controlled by the initialization activation signal RAND_ENABLE is thus configured to, during random deterministic initialization phases, isolate the output nodes NA, NB of the drawing stage 110 from one another and connect the output nodes of the drawing stage 110 to one another outside this random drawing stage.

The initialization circuit 100 also comprises a coupling stage 130 here formed here by a transistor 131, in particular of PMOS type, arranged between the first node NA and the first bit line BLT of the column COLi and by another transistor 132, in particular of PMOS type, arranged between the second node NB and the second bit line BLF of the column COLi. In the particular exemplary embodiment shown in FIG. 3, inverters 123, 124 are also provided between the nodes NA, NB of the coupling stage 130.

The respective gates of the transistors 131, 132 are controlled by a signal that depends on the signal RAND_E-NABLE, in this case in particular a signal at the output of an inverter 119, providing a signal complementary to the signal RAND_ENABLE.

Outside of the random deterministic initialization phases (RAND_ENABLE=0), the nodes NA, NB are isolated from the bit lines BLTi, BLFi. In this exemplary embodiment, it follows that the bit lines BLTi, BLFi are controlled to carry out free initialization of the memory cells; the access transistors of the cells being additionally made non-conductive to prevent any residual influence of the bit lines on the memory cells, even if the bit lines are not supplied.

During random deterministic initialization phases (RAND_ENABLE=1), the output nodes NA, NB are connected to the bit lines BLTi, BLFi in order to be able to charge or discharge the bit lines BLTi, BLFi respectively to a given potential which depends on that at which the first output node NA of the random drawing stage 110 is set and to another potential which depends on that at which the second node NB is set and which corresponds to a logic state complementary to that to which the given potential corresponds.

In this way, a same logic state is thus imposed on all the cells of the column COLi which are initialized by the initialization circuit 110i, this logic state being established randomly by the output of the random drawing stage 110. To enable the cells of a same column to be initialized, the initialization circuit is typically connected to means for simultaneously activating all or some of the word lines of the cell matrix.

Figure 4A:
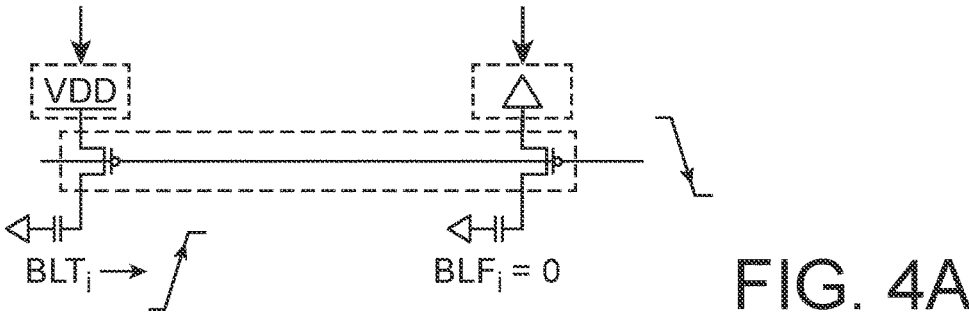
FIGS. 4A and 4B show different states to which the bit lines coupled to the column initialization circuit can be set.
Figure 4B:
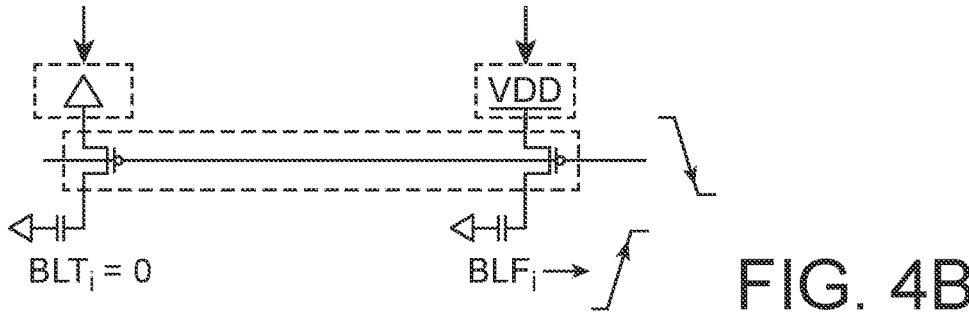

FIGS. 4A-4B show two successive phases of random deterministic initialization of a same column.

During a first initialization operation (FIG. 4A), following the reception or change of state of the activation signal RAND_ENABLE, for example a falling edge of this signal RAND_ENABLE, the output nodes NA, NB are respectively set to a first potential and to a second potential (out of a high potential VDD and a low potential GND or reference potential), so as to respectively charge the bit lines BLTi, BLFi to the first or second potential in order to impose a same logic state, in particular '1' or '0' to the nodes NT of the cells of this column, and a same logical state, in particular a '0' or '1' to the nodes NF of the cells of this column.

Figure 5:
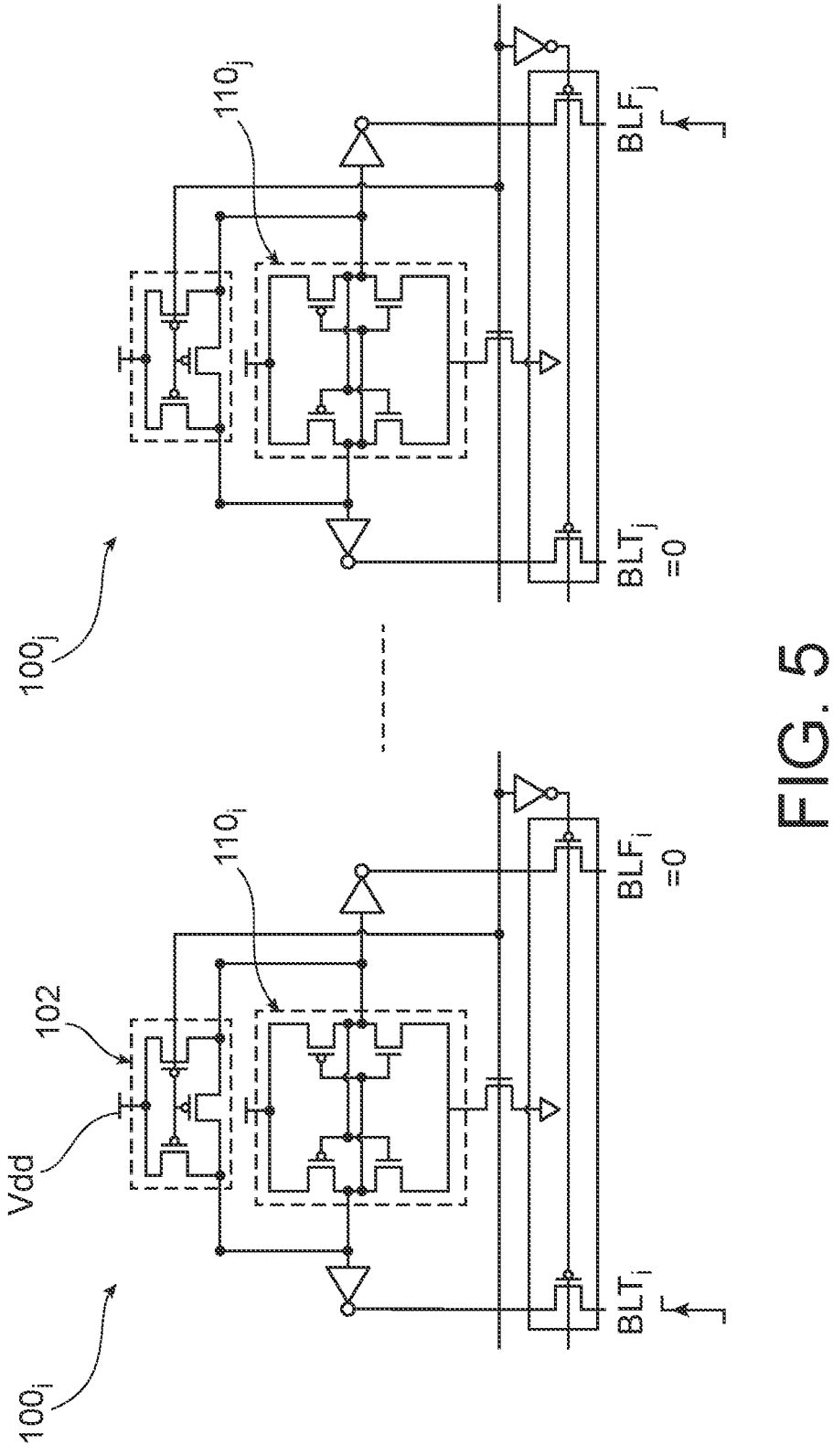
FIG. 5 shows different columns of a cell matrix, the columns of which are initialized independently of one another by means of their respective initialization circuits.

FIG. 5 shows a random deterministic initialization phase carried out on two distinct columns of a same matrix.

This phase following the reception or change of state of the activation signal RAND_ENABLE enables the bit lines BLTi, BLFi of a column COLi to be respectively charged to a high potential VDD and to a low potential or reference potential, whilst the bit lines BLTj, BLFj of another column COLj are respectively at a low potential or reference potential and at a high potential VDD, whilst their initialization circuits 100i, 100j, which are identical in design, randomly deliver outputs that are different from one another.

It should be noted that the present invention can be implemented with a random drawing stage 110 that is different to the one described above based on head-to-tail inverters. In this way, other random generators of distinct potentials corresponding to complementary logic states can be provided.

For example, a pseudo-random circuit to generate a bit based on a random seed can be used, of which there are many.

In addition, instead of having n circuits for drawing a random bit, it is possible alternatively to use a single circuit for drawing a sequence of n random or pseudo-random bits and to provide a link device between this single circuit for drawing n random bits and the various near-column initialization circuits provided to control the initialization of the cells of the column to a value corresponding to one of the bits of the sequence of n random bits.

For example, ring-oscillators can be used, as can optical devices or arbiter PUFs, as described in the document: "*PUF and Applications: A tutorial*", by C. Herder et al., IEEE 2014. It is sufficient to link an n-bit entropy source to an n-bit register. In this case, the circuit $100i$ associated with each column only comprises the coupling circuit 130 (with the transistors 131, 132) and the transistors 123 and 124. The output of the i-th bit of the n-bit register is directly connected to the node NA (input of the transistor 123) and connected to the node NB (input of the inverter 124) via an inverter. In other words, the memory device comprises in this embodiment a stage for drawing a random value shared within the memory replacing the n random drawing stages 110 in the embodiment described above with reference to FIG. 3.

Besides "random deterministic initialization" as described above, a memory device according to the invention can be provided to carry out other types of initialization, and in particular "free" and/or "deterministic" initializations as described in the aforementioned second patent application no. 2111286 filed by the applicant on 25 Oct. 2021.

With an initialization circuit as described in the present application, a new way of initializing all the cells of a same column to a same randomly determined state is added by means of a circuit provided with an entropy source that is different from that of the cells themselves. The entropy source performs the function of a random bit generator and can, in certain embodiments, be integrated into a voltage write amplifier, the outputs of which control the bit lines of a cell column in a complementary manner.

According to one alternative embodiment, it is possible for the random deterministic initialization to be performed not on all the cells of a same column, but only on some of the cells of a column. For example, in the case where the matrix has several areas with different access and security properties, it is possible, for example, to choose to initialize in a "random deterministic" manner the areas where you want to maximize the security and choose free initialization for the other less sensitive areas. Indeed, it should be noted that deterministic initialization requires the bit lines to be supplied with power, and the current draw can become significant if a large number of cells are initialized simultaneously. In this way, leaving free initialization for the non-critical cells and reserving deterministic initialization for the sensitive cells can be a good compromise in terms of consumption and current peak for the memory device. In general, random deterministic initialization can therefore be provided for only some of the cells of a column by providing line selection means enabling the access transistors to be switched on only in the cells you wish to initialize in this mode.

According to another alternative embodiment, it is also possible to provide random deterministic initialization based on an initialization circuit similar to the one described in the second patent application no. 2111286 filed by the applicant on 25 Oct. 2021, i.e. a control circuit that provides power to only one of the lines BLT or BLF as a function of the value that you wish to impose which has been previously defined by random drawing. In this way, it is possible, for example, to modify the circuit shown in FIG. 3 to provide control of the transistors 131 and 132 as a function, not only of the signal RAND_ENABLE, but also of the values present at the output of the inverters 123 and 124 after random drawing has been carried out. Similarly, if a pseudo-random number generator is used, the activation of one of the transistors 131 or 132 can also be conditional on the value of the bit of the register giving the random number after random drawing has been carried out.

Alternatively, it is possible to provide a control circuit that always controls the same bit line Bli or BLFi (and not the other one) but imposes either a supply voltage Vdd, or a reference voltage GND.

Such so-called "single" embodiments of a random deterministic initialization circuit enable the current draws that can result from a large number of cells to be limited. A drawback of such a "single" initialization circuit compared to a "differential" initialization circuit such as those described above with reference to FIGS. 1 and 3 is that the initialization operation is generally slower and potentially subject to a non-zero probability of initialization error, although such error may be acceptable in some applications. In this way, if the priority above all else is initialization speed, the memory matrix may have to be partitioned and reasonable-sized columns may have to be initialized by a same differential circuit.

In addition, random deterministic initialization can be applied in parallel to all or some of the columns of the matrix. Indeed, it may be necessary, for example in terms of managing current peaks, to initialize the columns sequentially, possibly in blocks of columns. In addition, depending on the architecture and organization of the memory matrix, it is possible that only certain columns have sensitive memory cells, for example because they store sensitive data, for which it is deemed appropriate to apply random deterministic initialization.

The invention claimed is:

1. A memory device comprising a memory matrix arranged in rows and columns of SRAM memory cells, each column comprising a first bit line and a second complementary bit line respectively connected to access transistors of the memory cells of the column, each column being associated with an initialization circuit comprising a first coupling element and a second coupling element positioned respectively between, on the one hand, the first and second bit lines of the associated column and, on the other hand, a control unit, the control unit being configured to impose a voltage on the bit lines when at least one of said coupling elements is rendered conductive in a deterministic initialization mode of all or some of the cells of the column, and wherein said control unit comprises at least a random value drawing stage for drawing a random value, said random value corresponding to a logical value, or a logic state from two possible values or logic states '0' or '1', and wherein, in a random deterministic initialization phase, the control unit is configured to successively control for a selected column to:

generate by said random value drawing stage a random value associated with said selected column; then activate of a coupling element among said first and second coupling elements of the initialization circuit associated with said selected column in order to connect at least one of the bit lines to the control unit which imposes a voltage value, the activated coupling element among said first and second coupling elements or the voltage value imposed by the control unit, being dependent of said generated random value for said selected column, and simultaneously activate access transistors of at least one cell of said selected column, wherein the random value drawing stage is able to be coupled to a column of cells from said columns and provided with a first output node and a second output node, said random value drawing stage being configured to, following the reception of an initialization activation signal, produce, in a random manner, respectively a first potential at the first node corresponding to a given logic state and a second potential at the second output node different from the first potential and corresponding to a given logic state complementary to said given logic state, and wherein at least one first initialization circuit associated with a first column being configured to, prior to a random deterministic initialization phase:

isolate the first output node and the second output node respectively from a first bit line and a second bit line of said first column, then, during the random deterministic initialization phase triggered by the reception of said initialization activation signal, allow the first output node and the second node to be set respectively at different potentials, while coupling the first output node to said first bit line and the second output node to said second bit line of the first column.

2. The memory device according to claim 1, wherein prior to the random deterministic initialization phase, the first output node and the second output node are isolated respectively from the first bit line and the second bit line of said first column while the first output node and the second node are set to a same potential.

3. The memory device according to claim 1, wherein said random value drawing stage is provided with a first inverter and a second inverter that are cross-coupled.

4. The memory device according to claim 1, wherein the initialization circuit comprises:

a transistor switching stage, arranged between a first biasing element and the output nodes of said random value drawing stage is configured to, outside random deterministic initialization phases, connect the output nodes of said random value drawing stage to the first biasing element and to isolate the output nodes of the random value drawing stage from said first biasing element during said random deterministic initialization phases, a switch element, in particular a transistor, configured to, outside said random deterministic initialization phases, isolate said stage for drawing a random value from a second biasing element and during said random deterministic initialization phases, connect said random value drawing stage to said second biasing element.

5. The memory device according to claim 4, wherein the transistor switching stage is further configured, outside of said random deterministic initialization phases, to isolate the output nodes of said random value drawing stage from one another and, during said random deterministic initialization phases, to connect the output nodes of said random value drawing stage to one another.

6. The memory device according to claim 1, wherein the first coupling element is a first coupling transistor between the first bit line and a first output node of the random value drawing stage, wherein the second coupling element is a second coupling transistor arranged between the second bit line and a second output node of the random value drawing stage, the first coupling transistor and the second coupling transistor being controlled by said random deterministic initialization activation signal.

7. The memory device according to claim 1, wherein said random value drawing stage comprises a shared stage for drawing a random number over several bits, each bit being associated with a column.

8. The memory device according to claim 1, wherein a first column is provided with a first random value drawing stage, a second column being provided with a second random value drawing stage.

9. The memory device according to claim 1, wherein at least part of the memory cell matrix includes so-called sensitive cells and comprising a memory controller able to impose a random deterministic initialization of these sensitive cells when the memory device is powered up or following an operation to delete the memory matrix.

* * * * *